(12) United States Patent
Dong et al.

(10) Patent No.: US 7,887,719 B2
(45) Date of Patent: Feb. 15, 2011

(54) PHOSPHOR SYSTEMS FOR A WHITE LIGHT EMITTING DIODE (LED)

(75) Inventors: Yi Dong, Tracy, CA (US); Ning Wang, Martinez, CA (US); Shifan Cheng, Dublin, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 530 days.

(21) Appl. No.: 11/900,307

(22) Filed: Sep. 10, 2007

(65) Prior Publication Data

US 2008/0073616 A1 Mar. 27, 2008

Related U.S. Application Data

(63) Continuation-in-part of application No. 10/912,741, filed on Aug. 4, 2004, now Pat. No. 7,267,787.

(51) Int. Cl.
*H01L 31/00* (2006.01)
(52) U.S. Cl. ............... 252/301.4 F; 313/503; 257/98
(58) Field of Classification Search ........... 252/301.4 F; 313/503; 257/98
See application file for complete search history.

(56) References Cited

U.S. PATENT DOCUMENTS

| | | | |
|---|---|---|---|
| 5,998,925 A | 12/1999 | Shimizu et al. | |
| 6,504,179 B1 | 1/2003 | Ellens et al. | |
| 6,621,211 B1 | 9/2003 | Srivastava et al. | |
| 6,649,946 B2 | 11/2003 | Bogner et al. | |
| 6,680,569 B2 | 1/2004 | Mueller-Mach | |
| 6,765,237 B1 | 7/2004 | Doxsee et al. | |
| 7,229,571 B2 | 6/2007 | Ezuhara | |
| 7,267,787 B2 * | 9/2007 | Dong et al. ........... | 252/301.4 F |

* cited by examiner

*Primary Examiner*—C. Melissa Koslow
(74) *Attorney, Agent, or Firm*—Fliesler Meyer LLP

(57) ABSTRACT

Novel phosphor systems for a white LED are disclosed. The phosphor systems are excited by a non-visible to near-UV radiation source having an excitation wavelength ranging from about 250 to 420 nm. The phosphor system may comprise one phosphor, two phosphors, and may include optionally a third and even a fourth phosphor. In one embodiment of the present invention, the phosphor is a two phosphor system having a blue phosphor and a yellow phosphor, wherein the long wavelength end of the blue phosphor is substantially the same wavelength as the short wavelength end of the yellow phosphor. Alternatively, there may be a wavelength gap between the yellow and blue phosphors. The yellow phosphor may be phosphate or silicate-based, and the blue phosphor may be silicate or aluminate-based. Single phosphor systems excited by non-visible radiation are also disclosed. In other embodiments of present invention, a single phosphor is used to produce white light illumination, the single phosphor having a broad emission spectrum with a peak intensity ranging from about 520 to 560 nm.

10 Claims, 15 Drawing Sheets

Prior Art

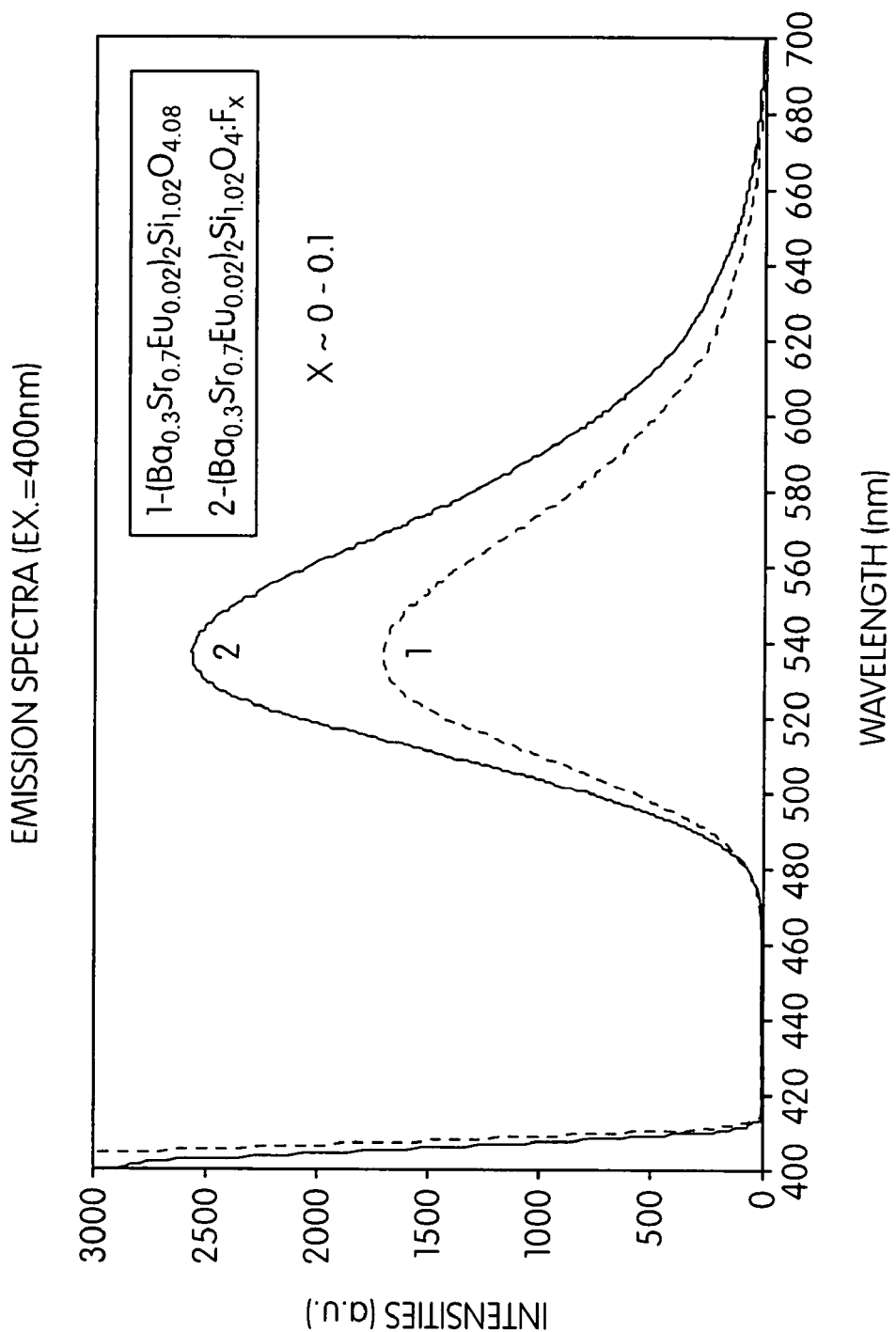

PHOSPHOR SYSTEMS FOR A WHITE LIGHT EMITTING DIODE (LED)

CROSS REFERENCE TO RELATED APPLICATIONS

This application is a Continuation-in-Part of U.S. application Ser. No. 10/912,741 now U.S. Pat. No. 7,267,787, filed Aug. 4, 2004, the specification and drawings of which are incorporated herein by reference.

BACKGROUND OF THE INVENTION

1. Field of the Invention

Embodiments of the present invention are directed in general to novel phosphors for use in a white light illumination system such as a white light emitting diodes (LED). In particular, the white LED's of the present invention comprise a radiation source emitting in the non-visible to near ultraviolet (UV) to purple wavelength range, a first luminescent material comprising a blue phosphor, and a second luminescent material comprising a yellow phosphor.

2. State of the Art

It has been suggested that white light illumination sources based wholly or in part on the light emitting diode will likely replace the conventional, incandescent light bulb. Such devices are often referred to as "white LED's," although this may be somewhat of a misnomer, as an LED is generally the component of the system that provides the energy to another component, a phosphor, which emits light of more-or-less one color; the light from several of these phosphors, possibly in addition to the light from the initial pumping LED are mixed to make the white light.

Nonetheless, white LED's are known in the art, and they are relatively recent innovations. It was not until LED's emitting in the blue/ultraviolet region of the electromagnetic spectrum were developed that it became possible to fabricate a white light illumination sources based on an LED. Economically, white LED's have the potential to replace incandescent light sources (light bulbs), particularly as production costs fall and the technology develops further. In particular, the potential of a white light LED is believed to be superior to that of an incandescent bulbs in lifetime, robustness, and efficiency. For example, white light illumination sources based on LED's are expected to meet industry standards for operation lifetimes of 100,000 hours, and efficiencies of 80 to 90 percent. High brightness LED's have already made a substantial impact on such areas of society as traffic light signals, replacing incandescent bulbs, and so it is not surprising that they will soon provide generalized lighting requirements in homes and businesses, as well as other everyday applications.

Chromaticity Coordinates on a CIE Diagram, and the CRI

White light illumination is constructed by mixing various or several monochromatic colors from the visible portion of the electromagnetic spectrum, the visible portion of the spectrum comprising roughly 400 to 700 nm. The human eye is most sensitive to a region between about 475 and 650 nm. To create white light from either a system of LED's, or a system of phosphors pumped by a short wavelength LED, it is necessary to mix light from at least two complementary sources in the proper intensity ratio. The results of the color mixing are commonly displayed in a CIE "chromaticity diagram," where monochromatic colors are located on the periphery of the diagram, and white at the center. Thus, the objective is to blend colors such that the resulting light may be mapped to coordinates at the center of the diagram.

Another term of art is "color temperature," which is used to describe the spectral properties of white light illumination. The term does not have any physical meaning for "white light" LED's, but it is used in the art to relate the color coordinates of the white light to the color coordinates achieved by a black-body source. High color temperature LED's versus low color temperature LED's are shown at www.korry.com.

Chromaticity (color coordinates on a CIE chromaticity diagram) has been described by Srivastava et al. in U.S. Pat. No. 6,621,211. The chromaticity of the prior art blue LED-YAG:Ce phosphor white light illumination system described above are located adjacent to the so-called "black body locus," or BBL, between the temperatures of 6000 and 8000 K. White light illumination systems that display chromaticity coordinates adjacent to the BBL obey Planck's equation (described at column 1, lines 60-65 of that patent), and are desirable because such systems yield white light which is pleasing to a human observer.

The color rendering index (CRI) is a relative measurement of how an illumination system compares to that of a black body radiator. The CRI is equal to 100 if the color coordinates of a set of test colors being illuminated by the white light illumination system are the same as the coordinates generated by the same set of test colors being irradiated by a black body radiator.

Prior Art Approaches to Fabricating White LED's

In general, there have been three general approaches to making white LED's. One is to combine the output from two or more LED semiconductor junctions, such as that emitted from a blue and a yellow LED, or more commonly from a red, green, and blue (RGB) LED's. The second approach is called phosphor conversion, wherein a blue emitting LED semiconductor junction is combined with a phosphor. In the latter situation, some of the photons are down-converted by the phosphor to produce a broad emission centered on a yellow frequency; the yellow color then mixes with other blue photons from the blue emitting LED to create the white light.

Phosphors are widely known, and may be found in such diverse applications as CRT displays, UV lamps, and flat panel displays. Phosphors function by absorbing energy of some form (which may be in the form of a beam of electrons or photons, or electrical current), and then emitting the energy as light in a longer wavelength region in a process known as luminescence. To achieve the required amount of luminescence (brightness) emitted from a white LED, a high intensity semiconductor junction is needed to sufficiently excite the phosphor such that it emits the desired color that will be mixed with other emitted colors to form a light beam that is perceived as white light by the human eye.

In many areas of technology, phosphors are zinc sulfides or yttrium oxides doped with transition metals such as Ag, Mn, Zn, or rare earth metals such as Ce, Eu, or Tb. The transition metals and/or rare earth element dopants in the crystal function as point defects, providing intermediate energy states in the material's bandgap for electrons to occupy as they transit to and from states in the valence band or conduction band. The mechanism for this type of luminescence is related to a temperature dependent fluctuation of the atoms in the crystal lattice, where oscillations of the lattice (phonons) cause displaced electron to escape from the potential traps created by the imperfections. As they relax to initial state energy states they may emit light in the process.

U.S. Pat. No. 5,998,925 to Shimizu et al. discloses the use of a 450 nm blue LED to excite a yellow phosphor comprising a yttrium-aluminum-garnet (YAG) fluorescent material. In this approach a InGaN chip functions as a visible, blue-light emitting LED, and a cerium doped yttrium aluminum garnet (referred to as "YAG:Ce") serves as a single phosphor in the system. The phosphor typically has the following stoichiometric formula: $Y_3Al_5O_{12}:Ce^{3+}$. The blue light emitted by the blue LED excites the phosphor, causing it to emit yellow light, but not all the blue light emitted by the blue LED is absorbed by the phosphor; a portion is transmitted through the phosphor, which then mixes with the yellow light emitted by the phosphor to provide radiation that is perceived by the viewer as white light.

U.S. Pat. No. 6,504,179 to Ellens et al. disclose a white LED based on mixing blue-yellow-green (BYG) colors. The yellow emitting phosphor is a Ce-activated garnet of the rare earths Y, Tb, Gd, Lu, and/or La, where a combination of Y and Tb was preferred. In one embodiment the yellow phosphor was a terbium-aluminum garnet (TbAG) doped with cerium ($Tb_3Al_5O_{12}$—Ce). The green emitting phosphor comprised a CaMg chlorosilicate framework doped with Eu (CSEu), and possibly including quantities of further dopants such as Mn. Alternative green phosphors were $SrAl_2O_4:Eu^{2+}$ and $Sr_4Al_{14}O_{25}:Eu^{2+}$. New material in replace 5998925, using 450 nm Blue LED to excite mixture of green and yellow phosphors ($Tb_3Al_5O_{12}$—Ce).

U.S. Pat. No. 6,649,946 to Bogner et al. disclosed yellow to red phosphors based on alkaline earth silicon nitride materials as host lattices, where the phosphors may be excited by a blue LED emitting at 450 nm. The red to yellow emitting phosphors uses a host lattice of the nitridosilicate type $M_xSi_yN_z$: Eu, wherein M is at least one of an alkaline earth metal chosen from the group Ca, Sr, and Ba, and wherein $z=\frac{2}{3}x+\frac{4}{3}y$. One example of a material composition is $Sr_2Si_5N_8:Eu^{2+}$. The use of such red to yellow phosphors was disclosed with a blue light emitting primary source together with one or more red and green phosphors. The objective of such a material was to improve the red color rendition R9 (adjust the color rendering to red-shift), as well as providing a light source with an improved overall color rendition Ra.

U.S. Pat. No. 6,680,569 to Mueller-Mach disclosed a light emitting device having a (supplemental) fluorescent material that receives primary light from a blue LED having a peak wavelength of 470 nm, the supplemental fluorescent material radiating light in the red spectral region of the visible light spectrum. The supplementary fluorescent material is used in conjunction with a main fluorescent material to increase the red color component of the composite output light, thus improving the white output light color rendering. In a first embodiment, the main fluorescent material is a Ce activated and Gd doped yttrium aluminum garnet (YAG), while the supplementary fluorescent material is produced by doping the YAG main fluorescent material with Pr. In a second embodiment, the supplementary fluorescent material is a Eu activated SrS phosphor. The red phosphor may be, for example, $(Sr-BaCa)_2Si_5N_8:Eu^{2+}$. The main fluorescent material (YAG phosphor) has the property of emitting yellow light in response to the primary light from the blue LED. The supplementary fluorescent material adds red light to the blue light from the blue LED and the yellow light from the main fluorescent material.

Disadvantages of the Prior Art Blue LED-YAG:Ce Phosphor White Light Illumination System The blue LED-YAG:Ce phosphor white light illumination system of the prior art has disadvantages. One disadvantage is that this illumination system produces white light with color temperatures ranging from 6000 to 8000 K, which is comparable to sunlight, and a typical color rendering index (CRI) of about 70 to 75. These specifications are viewed as a disadvantage because in some instances white light illumination systems with a lower color temperature are preferred, such as between about 3000 and 4100 K, and in other cases a higher CRI is desired, such as above 90. Although the color temperature of this type of prior art system can be reduced by increasing the thickness of the phosphor, the overall efficiency of the system decreases with such an approach.

Another disadvantage of the blue LED-YAG:Ce phosphor white light illumination system of the prior art is that the output of the system may vary due to manufacturing inconsistencies of the LED. The LED color output (quantified by the spectral power distribution and the peak emission wavelength) varies with the bandgap of the LED active layer and with the power that is applied to the LED. During production of the LEDs, a certain percentage are manufactured with active layers whose actual bandgaps are either larger or smaller than the desired width. Thus, the color output of such LEDs deviates from desired parameters. Furthermore, even if the bandgap of a particular LED has the desired width, during operation of the white light illumination system frequently deviates from the desired value. This also causes the color output of the LED to deviate from desired parameters. Since the white light emitted from the illumination system contains a blue component from the LED, the characteristics of the light output from the illumination system may vary as the characteristics of the light output from the LED vary. A significant deviation from desired parameters may cause the illumination system to appear non-white; i.e., bluish if the LED output is more intense than desired, and yellowish if less intense.

LEDs that emit in the visible, such as the prior art LEDs having an InGaN active layer, suffer from the disadvantage that a variation in the In to Ga ratio during the deposition of the InGaN layer results in an active layer whose band gap width which may deviate from the desired thickness. Variations in the color output of the phosphor (the luminescent portion of the white light illumination system) do not depend as much on compositional variations of the phosphor as they do on compositional variations in the blue LED. Furthermore, the manufacture of the phosphor is less prone to compositional errors than is the manufacture of the LED. Another advantage of using excitation wavelengths around 400 nm from the radiation source is that an LED such as GaInAlN has its highest output intensity around this range.

Thus, what is needed in the art is a white light illumination system with a radiation source emitting substantially in the non-visible, phosphors whose color output is stable, and whose color mixing results in the desired color temperature and color rendering index.

SUMMARY OF THE INVENTION

In one embodiment of the present invention, a white LED comprises a radiation source configured to emit radiation having a wavelength ranging from about 250 to 420 nm; a yellow phosphor configured to absorb at least a portion of the radiation from the radiation source and emit light with peak intensity in a wavelength ranging from about 530 to 590 nm; and a blue phosphor configured to absorb at least a portion of the radiation from the radiation source and emit light with peak intensity in a wavelength ranging from about 470 to 530 nm.

The 250 to 400 m portion of the radiation emitted by the radiation source is substantially non-visible ultraviolet (UV) radiation, and the 400 to 420 nm portion is substantially near-UV light from the electromagnetic spectrum. The radiation source may be a light emitting diode (LED).

According to this embodiment, the yellow phosphor may be either a silicate-based phosphor or a phosphate-based phosphor. If the yellow phosphor is a silicate-based phosphor, it may have the formula $A_2SiO_4:Eu^{2+}$, where A is at least one divalent metal selected from the group of consisting of Sr, Ca, Ba, Mg, Zn, and Cd. Also disclosed in the present disclosure are silicates containing fluorine dopants, such that the yellow phosphor may have the formula $A_2SiO_4:Eu^{2+}F$, with A defined the same as above. There may be more than one type of the divalent metal A present in any one phosphor. The purpose of the Eu is to serve as the luminescent activator, substituting for at least a portion of any of the A divalent metals, wherein the Eu is present in about a zero to 10% mole ratio. An example of a yellow phosphor fitting this description is $Sr_{0.98-x-y}Ba_xCa_yEu_{0.02}SiO_4$ where $0 \leq x \leq 0.8$ and $0 \leq y \leq 0.8$. Alternatively, the yellow phosphor may be phosphate-based phosphor according to the formula $(Sr_{1-x-y}Eu_xMn_y)_2P_{2+z}O_7$ where $0.03 \leq x \leq 0.08$, $0.06 \leq y \leq 0.16$, and $0 \leq z \leq 0.05$.

Further according to this embodiment, the blue phosphor may be a silicate-based phosphor or an aluminate-based phosphor. For example, the blue phosphor may fit the description $Sr_{0.98-x-y}Mg_xBa_yEu_{0.02}SiO_4$; where $0 \leq x \leq 1.0$; and $0 \leq y \leq 1.0$. If the blue phosphor is an aluminate, it may either have the formula $Sr_{1-x}MgEu_xAl_{10}O_{17}$; where $0.2 \leq x \leq 1.0$, or $Sr_xEu_{0.1}Al_{14}O_{25}$, wherein x is less than 4. In one embodiment, the formula for this phosphor is $Sr_{3.9}Eu_{0.1}Al_{14}O_{25}$.

In an alternative embodiment, the white LED comprises a radiation source configured to emit radiation having a wavelength ranging from about 250 to 420 nm; a yellow phosphor configured to absorb at least a portion of the radiation from the radiation source and emit light with a peak intensity in a wavelength ranging from about 550 to 590 nm; and a blue phosphor configured to absorb at least a portion of the radiation from the radiation source and emit light with a peak intensity in a wavelength ranging from about 480 to 510 nm.

In other embodiments, the yellow phosphor is configured to absorb at least a portion of the radiation from the radiation source and emit light in a wavelength ranging from about 550 to 575 nm; and the blue phosphor configured to absorb at least a portion of the radiation from the radiation source and emit light in a wavelength ranging from about 480 to 495 nm.

An alternative embodiment of the present invention is a single phosphor system for a white LED, the phosphor system comprising a radiation source configured to emit radiation having a wavelength ranging from about 250 to 420 nm, the single phosphor configured to absorb at least a portion of the radiation from the radiation source and emit a broad spectrum light with a peak intensity in a wavelength ranging from about 520 to 560 nm.

In each of these cases, the yellow phosphor may be silicate or phosphate-based, and the blue phosphor may be silicate or aluminate-based, as discussed elsewhere in this disclosure.

Further embodiments of the present invention include methods of producing white light illumination from a one or two-phosphor system (the phosphor system optionally including even a third and/or fourth phosphor). Such methods may comprise the steps of providing a radiation source configured to emit radiation having a wavelength ranging from about 250 to 420 nm; exposing a yellow phosphor to at least a portion of the radiation from the radiation source to produce light having a wavelength ranging from about 530 to 590 nm; exposing a blue phosphor to at least a portion of the radiation from the radiation source to produce light having a wavelength ranging from about 470 to 530 nm; and mixing the light from the yellow phosphor with the light from the blue phosphor to produce the white illumination.

BRIEF DESCRIPTION OF THE DRAWINGS

FIG. 8 is an emission spectra of the exemplary yellow phosphors $(Sr_{0.7}Ba_{0.3}Eu_{0.02})_2Si_{1.02}O_{4.08}$ and $(Sr_{0.7}Ba_{0.3}Eu_{0.02})_2Si_{1.02}O_{4.08-x}F_x$ tested under 400 nm excitation radiation, showing that the emission intensity is significantly increased by doping the composition with fluorine;

DETAILED DESCRIPTION OF THE INVENTION

The white light illumination system of the present embodiments depends on an excitation source that does not contribute substantially to the white light output of the system because the excitation source emits in a region of the electromagnetic spectrum that is not visible to the human eye. The concepts are illustrated schematically in FIGS. 1 and 2.

Figure 1:
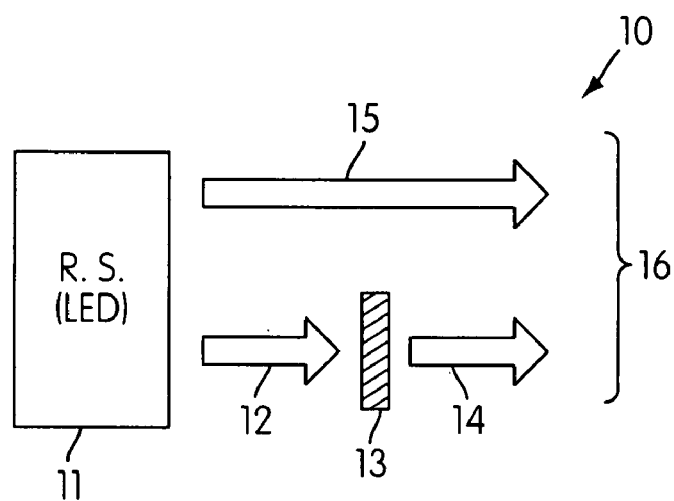
FIG. 1 is a schematic representation of a prior art illumination system comprising a radiation source that emits in the visible and a phosphor that emits in response to the excitation from the radiation source, wherein the light produced from the system is a mixture of the light from the phosphor and the light from the radiation source.

Referring to the prior art system 10 of FIG. 1, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material that is capable of emitting light 14 after absorbing energy from the LED 11. The light 14 is typically yellow. Radiation source 11 also emits blue light in the visible that is not absorbed by the phosphor 13; this is the visible blue light 15 shown in FIG. 1. The visible blue light 15 mixes with the yellow light 14 to provide the desired white illumination 16 shown in the figure. A disadvantage of the prior art illumination system 10 of FIG. 1 is that the color output of the system 10 depends on the output 15 of the radiation source 11.

The color output of the present white light illumination system does not vary significantly with the color output of the radiation source (e.g., LED) if the white light emitted by the system does not emit radiation at a wavelength that is significantly visible to the human eye. For example, and LED may be constructed to emit ultraviolet (UV) radiation having a wavelength of 380 nm or less, which is not visible to the human eye. Furthermore, the human eye is not very sensitive to UV radiation having a wavelength between about 380 and 400 nm, nor is it substantially sensitive to violet light having a wavelength between about 400 and 420 nm. Therefore, the radiation emitted by a source having a wavelength of about 420 nm or less will not substantially affect the color output of the white light illumination system.

Figure 2:
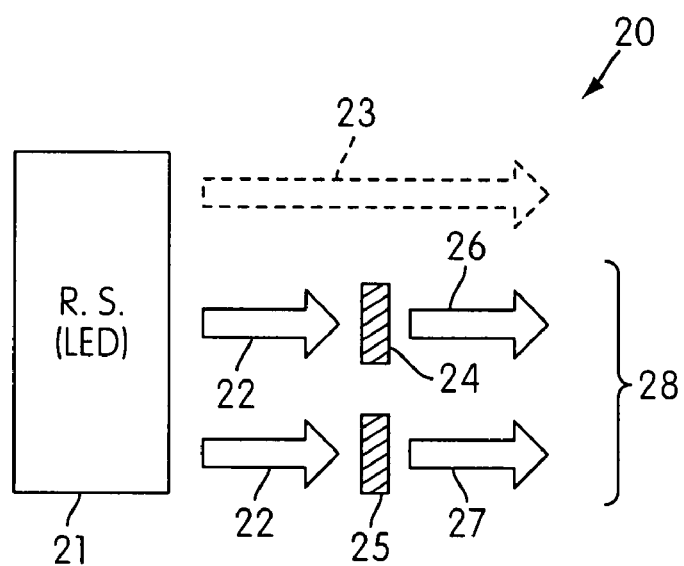
FIG. 2 is a schematic representation of a prior art illumination system comprising a radiation source that emits in the non-visible such that the light coming from the radiation source does not contribute to the light produced by the illumination system.
Figure 1A:
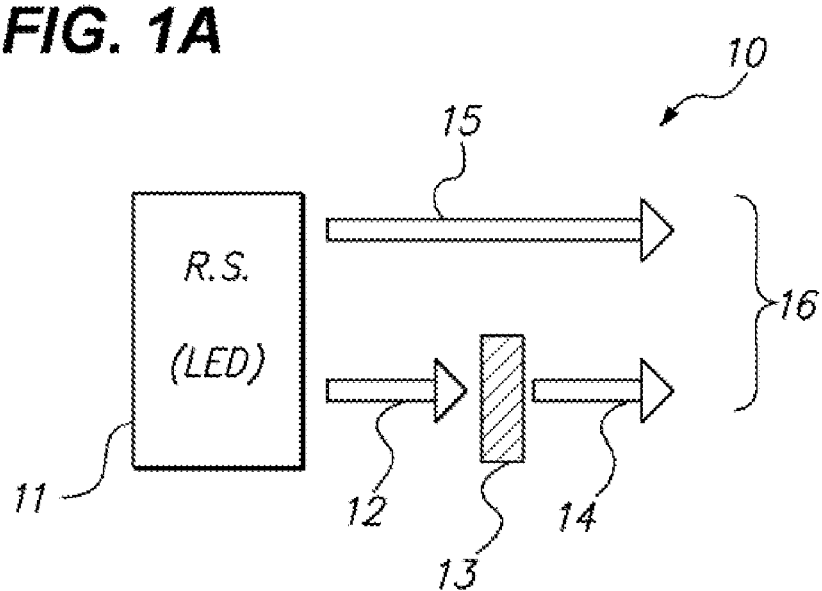
Figure 1B:
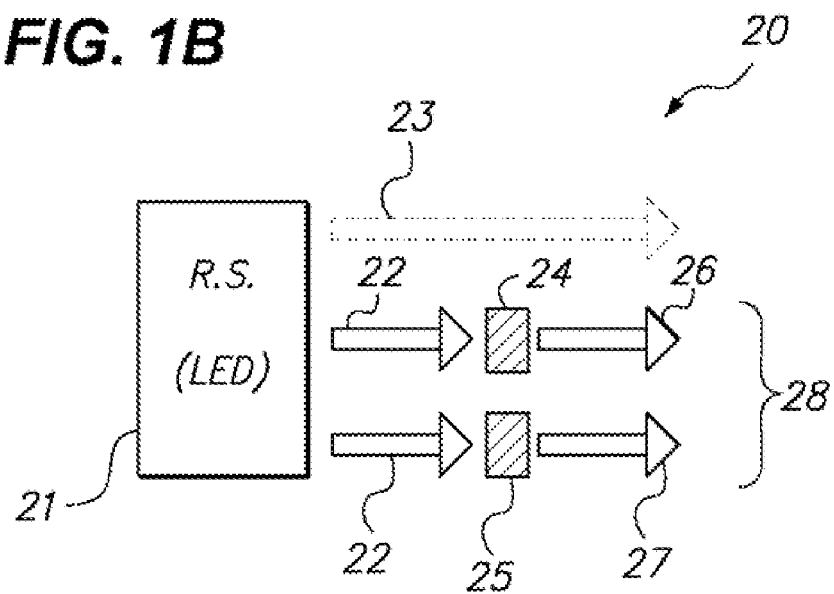

This aspect of the present invention is illustrated in FIG. 2. Referring to the white illumination system shown generally at 20 FIG. 2, substantially non-visible light is emitted from radiation source 21 as light 22, 23. Light 22, 23 has the same characteristics, but different reference numerals have been used to illustrate the following point: light 22 may be used to excite a phosphor, such as phosphor 24 or 25 to create light 26 and 27, respectively, but that light 23 emitted from the radiation source 21 which does not impinge on a phosphor does not contribute to the color output 28 from the phosphor(s) because light 23 is substantially invisible to the human eye. In one embodiment of the present invention, radiation source 21 is an LED that emits light having a wavelength generally ranging from about 250 to 410 nm. In alternative embodiments, radiation sources having excitation wavelengths up to 420 nm are feasible. It will be understood by those skilled in the art that near UV radiation 400 nm and higher may contribute to the color rendition of the white light emitted from the white light LED if the radiation source is strong enough in its intensity.

A second way to avoid affecting the color output of the white illumination system 30 is to configure the luminescent materials 24, 25 (referring to FIG. 2) such that they each have a thickness that is sufficient to prevent radiation from the LED 21 from passing through the material. For example, if the LED emits visible light between about 420 and 650 nm, then in order to ensure that the phosphor thickness does not affect the color output of the system, the phosphor should be thick enough to prevent any significant amount of the visible radiation emitted by the LED from penetrating through the phosphor.

Prior art methods have included phosphors that may be excited by ultraviolet LED's. U.S. Pat. No. 6,555,958 to Srivastava et al. described a blue-green illumination system excited by a UV LED emitting in the range 360-420 nm. The luminescent material was a phosphor having the material composition $Ba_2SiO_4:Eu^{+2}$, $Ba_2(MgZn)Si_2O_7:Eu^{+2}$, and/or $Ba_2Al_2O_4:Eu^{+2}$. Although this patent teaches the use of a non-visible radiation source, there is only one phosphor designed to produce light in the blue-green region of the spectrum.

A prior art method designed to emit white light using a non-visible UV LED was disclosed in U.S. Pat. No. 6,621,211 to Srivastava et al. The white light produced in this method was created by non-visible radiation impinging on three, and optionally a fourth, phosphor, of the following types: the first phosphor emitted orange light having a peak emission wavelength between 575 and 620 nm, and preferably comprised a europium and manganese doped alkaline earth pyrophosphate phosphor according to the formula $A_2P_2O_7:Eu^{2+}$, $Mn^{2+}$ Alternatively, the formula for the orange phosphor could be written $(A_{1-x-y}Eu_xMn_y)_2P_2O_7$, where $0<x\leqq0.2$, and $0<y\leqq0.2$. The second phosphor emits blue-green light having a peak emission wavelength between 495 and 550 nm, and is a divalent europium activated alkaline earth silicate phosphor $ASiO:Eu^{2+}$, where A comprised at least one of Ba, Ca, Sr, or Mb. The third phosphor emitted blue light having a peak emission wavelength between 420 and 480 nm, and comprised either of the two commercially available phosphors "SECA," $D_5(PO_4)_3Cl:Eu^{2+}$, where D was at least one of Sr, Ba, Ca, or Mg, or "BAM," which may be written as $AMg_2Al_{16}O_{27}$, where A comprised at least one of Ba, Ca, or Sr, or $BaMgAl_{10}O_{17}:Eu^{2+}$. The optional fourth phosphor emits red light having a peak emission wavelength between 620 and 670 nm, and it may comprise a magnesium fluorogermanate phosphor $MgO*MgF*GeO:Mn^{4+}$.

The prior art described above made use of a non-visible radiation source to excite the phosphors of the illumination system, but not described in that art was a white light illumination system that utilized a non-visible radiation source with relatively few phosphors. U.S. Pat. No. 6,555,958 disclosed only one phosphor, but the application was for a blue-green illumination system, and so only one phosphor was needed. The application in U.S. Pat. No. 6,621,211 was for a white light illumination system, but three (and optionally a fourth) phosphors were required to generate white light. What has not been described in the prior art is a white light illumination system that uses only one, two, and optionally a third phosphor with a non-visible radiation system. The advantages of reducing the number of phosphors include ease of manufacture, cost, and quality of the white light thus produced. The next section will focus on the novel phosphors of the present embodiments.

Emission Wavelength Ranges of the Phosphors

Figure 3:
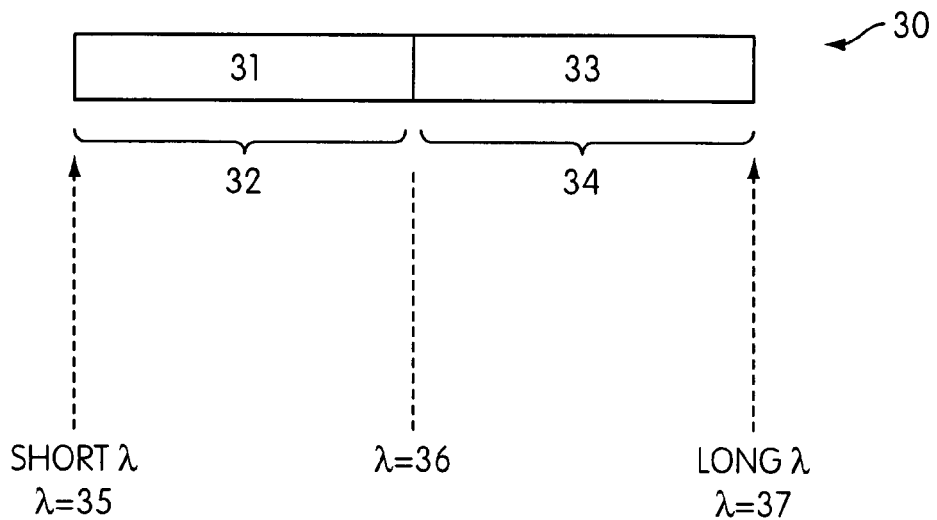
FIG. 3 is a schematic representation of the emission wavelengths of a two phosphor system, showing how the long wavelength end of one of the phosphors may be substantially the same as the short wavelength end of the other phosphor.

According to embodiments of the present invention, a white light illumination system is provided comprising two phosphors. In this embodiment, a first phosphor is configured to absorb at least a portion of radiation emitted from a non-visible radiation source and emit light in one wavelength range, and a second phosphor configured to absorb at least a portion of radiation emitted from a non-visible radiation source and emit light in a second wavelength range, where the longest wavelength of one of the ranges is substantially the same as the shortest wavelength of the other. This concept is illustrated in FIG. 3. Referring to FIG. 3, a phosphor system shown generally at 30 comprises a first phosphor 31 having a peak emission within the wavelength range depicted by the reference numeral 32, and a second phosphor 33 having a peak emission within the range depicted by the reference numeral 34. The short wavelength end of phosphor 31 is represented by the reference numeral 35, and the long wavelength end of phosphor 31 represented by wavelength 36. Similarly, the long wavelength end of phosphor 33 is represented by wavelength 37, and the short wavelength end of phosphor 33 is represented by numeral 36. Hence, the long wavelength end of phosphor 31 is substantially the same as the short wavelength end of phosphor 33.

Figure 4:
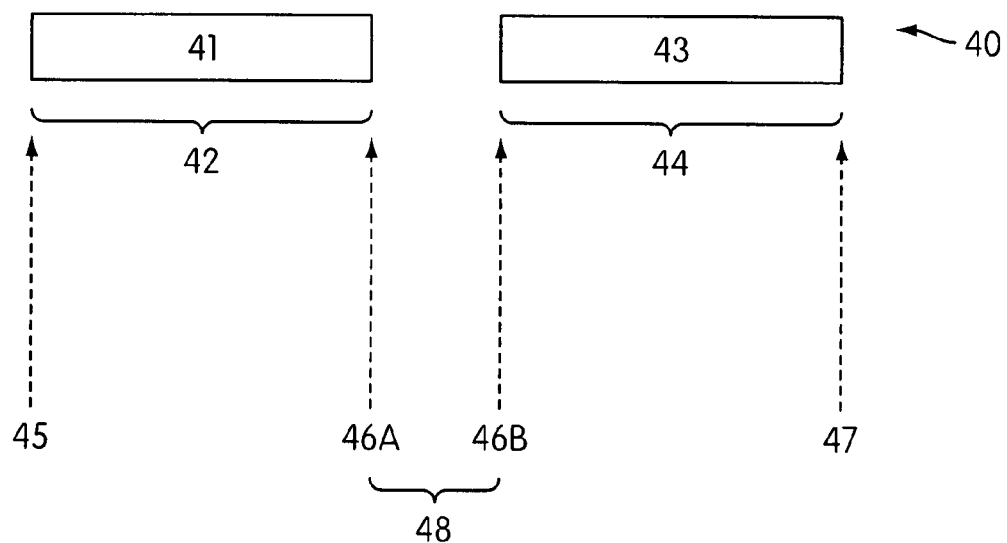
FIG. 4 is a schematic representation of the emission wavelengths of a two phosphor system, wherein in this embodiment there is a wavelength gap between the long wavelength end of one of the phosphors and the short wavelength end of the other phosphor.

In an example of this embodiment, the phosphor 33 may be a yellow phosphor configured to absorb at least a portion of the radiation from the radiation source and emit light in a wavelength ranging from about 530 to 590 nm, and the phosphor 31 may be a blue phosphor configured to absorb at least a portion of the radiation from the radiation source and emit light in a wavelength ranging from about 470 to 530 nm. In this embodiment, the longest wavelengths of the blue phosphor's emission are substantially equal to the shortest wavelengths of the yellow phosphor's emission. The radiation source in this embodiment may be an LED designed to emit radiation in the non-visible portion of the electromagnetic spectrum, or in a portion of the spectrum where the human eye is not substantially sensitive, such as an LED emitting in a wavelength ranging from about 250 to 420 nm;

In an alternative embodiment, a two phosphor system may be designed similar to the system of FIG. 3, except where there is a slight gap between the longest wavelength of the first phosphor, and the shortest wavelength of the second phosphor. This concept is illustrated in FIG. 4. Referring to FIG. 4, a phosphor system shown generally at 40 comprises a first phosphor 41 having a peak emission within the wavelength range depicted by the reference numeral 42, and a second phosphor 43 having a peak emission within the range depicted by the reference numeral 44. The short wavelength end of phosphor 41 is represented by the reference numeral 45, and the long wavelength end of phosphor 41 represented by wavelength 46A. Similarly, the long wavelength end of phosphor 43 is represented by wavelength 47, and the short wavelength end of phosphor 43 is represented by numeral 46B. Hence, a gap 48 is developed between the long wavelength end of phosphor 41 and the short wavelength end of phosphor 43. Adjusting the size of the wavelength gap 48 to enhance the quality of the white light provided by the white light illumination system is one of the novel features of the present embodiments.

By way of example, the phosphor 43 may be a yellow phosphor configured to absorb at least a portion of the radiation from the radiation source and emit light in a wavelength ranging from about 540 to 580 nm, and the phosphor 41 may be a blue phosphor configured to absorb at least a portion of the radiation from the radiation source and emit light in a wavelength ranging from about 480 to 510 nm. Thus, the gap 48 in this embodiment would be about 30 nm. In an alternative embodiment, the phosphor 43 may be a yellow phosphor configured to emit light in a wavelength ranging from about 550 to 575 nm, and the phosphor 41 may be a blue phosphor configured to emit light in a wavelength ranging from about 480 to 495 nm. In this embodiment, the gap 48 would be about 55 nm.

In an alternative embodiments, the phosphor 43 is a still a yellow phosphor configured to absorb at least a portion of the radiation from the radiation source causing it to emit light yellow light, and phosphor 41 still a blue phosphor configured to absorb at least a portion of the radiation from the radiation source causing it to emit blue light. What varies in these embodiments is the long wavelength end of phosphor 41 (which may be a blue phosphor), the short wavelength end of phosphor 43 (which may be a yellow phosphor), and the size of the gap between. These may be varied in such a manner that: 1) the center of the gap remains constant, and it is the size of the gap that varies, and 2) the size of the gap remains constant, so it is the position of that same-sized gap that varies in wavelength space.

Exemplary ranges of the first class phosphor sets have the long end of phosphor 41 at about 520, 515, 505, and 500 nm; the short end of phosphor 43 at 530, 535, 545, and 550; such that the size of the gaps between the two are 10, 20, 40, and about 50 nm, respectively. Exemplary ranges of the second class of phosphor sets have long end of phosphor 41 at about 505, 500, 515, and 520; the short end of phosphor 43 at about 535, 530, 545, and 550 nm, respectively, so that the gap sizes are always about 30 nm in each case. Thus, the centers of the gaps are, respectively, 515 nm, 520 nm, 525 nm, 530 nm, and 535 nm as claimed in claims 6-10.

Exemplary Yellow Phosphors

According to embodiments of the present invention, the yellow phosphor 33, 43 may be either a silicate-based phosphor or a phosphate-based phosphor. Additionally, the yellow phosphor 33, 43 may have the formula $M_1M_2M_3SiO_4$, wherein $M_1$, $M_2$ and $M_3$ are individually either Sr, Ca, or Ba. If the yellow phosphor 33, 43 is a silicate-based phosphor, then it may have the formula $Sr_{1-x-y}Mg_xBa_ySiO_4$; where $0 \leq x \leq 0.8$, and $0 \leq y \leq 0.8$. In alternative embodiments, the silicate-based, yellow phosphor 33, 34 may conform to the same formula where $0 \leq x \leq 0.5$ and $0 \leq y \leq 0.3$, or where $0.5 \leq x \leq 0.7$ and $0.2y \leq 5$. Alternatively, the yellow phosphor 33, 43 may have the formula $Sr_{1-x-y}Ba_xCa_ySiO_4:Eu^{2+}F$; where $0 \leq x \leq 0.8$ and $0 \leq y \leq 0.8$, where $0 \leq x \leq 0.5$ and $0 \leq y \leq 0.3$, where $0.5 \leq x \leq 0.7$ and $0.2 \leq y \leq 0.5$, and where $0.3 \leq x \leq 0.8$ and $0.1 \leq y \leq 0.5$.

Figure 5:
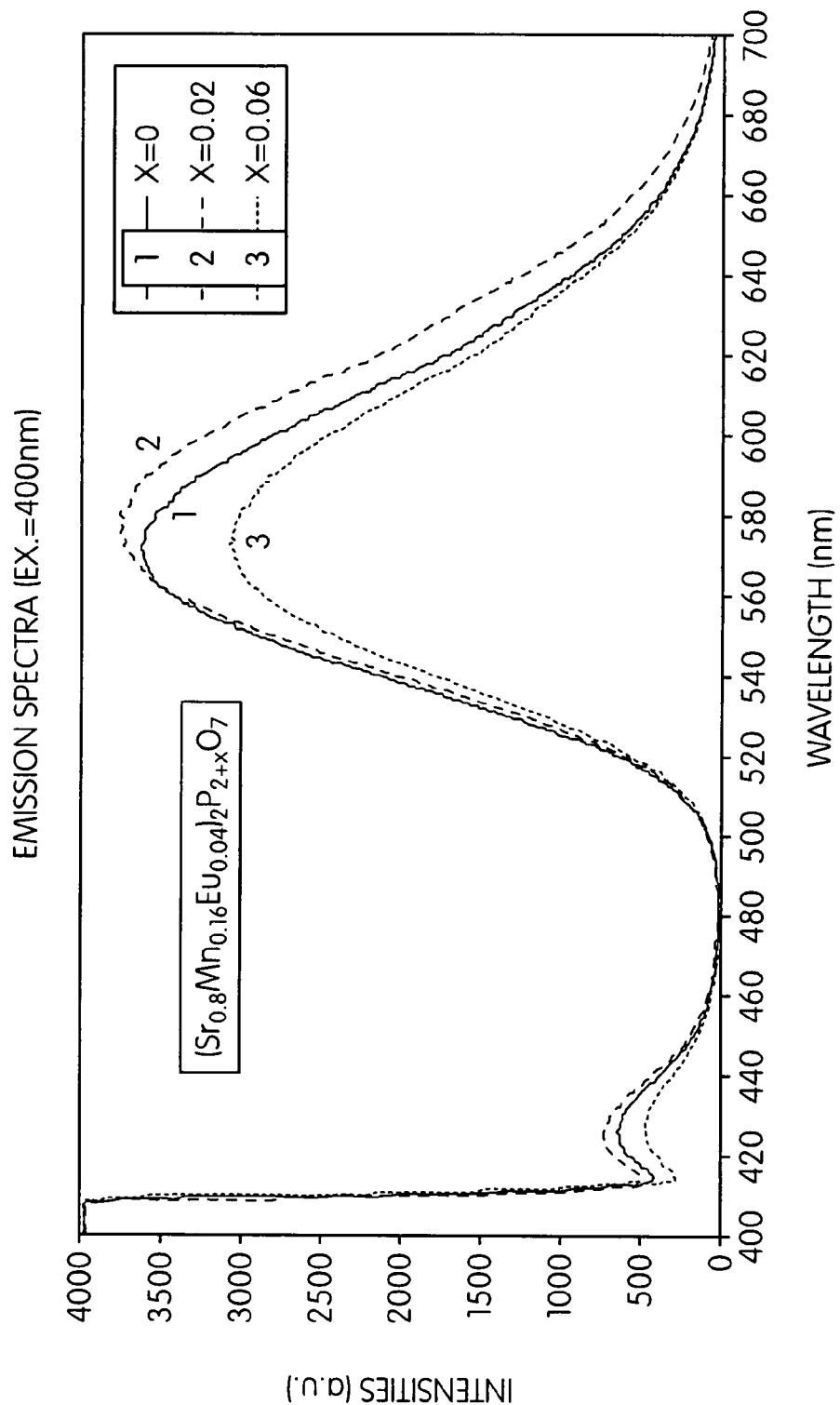
FIG. 5 is an emission spectra of an exemplary phosphate-based yellow phosphor according to the present embodiments, showing how a variation in the amount of phosphorus in the phosphor affects emission wavelength slightly, and the emission intensity strongly.

As a specific example, the phosphate-based yellow phosphor having the formula $(Sr_{0.8}Mn_{0.16}Eu_{0.04})_2P_{2+x}O_7$ is now discussed in relation to FIG. 5, which is an emission spectra showing how a variation in the amount of phosphorus in the phosphor affects emission wavelength slightly, and the emission intensity strongly. The phosphor was excited by a radiation source having a wavelength of about 400 nm. FIG. 5 shows that increasing the phosphorus stoichiometry of this phosphor from 2.00 to 2.02 increases the intensity of the emission, but then further increasing the stoichiometry to 2.06 decreases the intensity of the emission.

Figure 6:
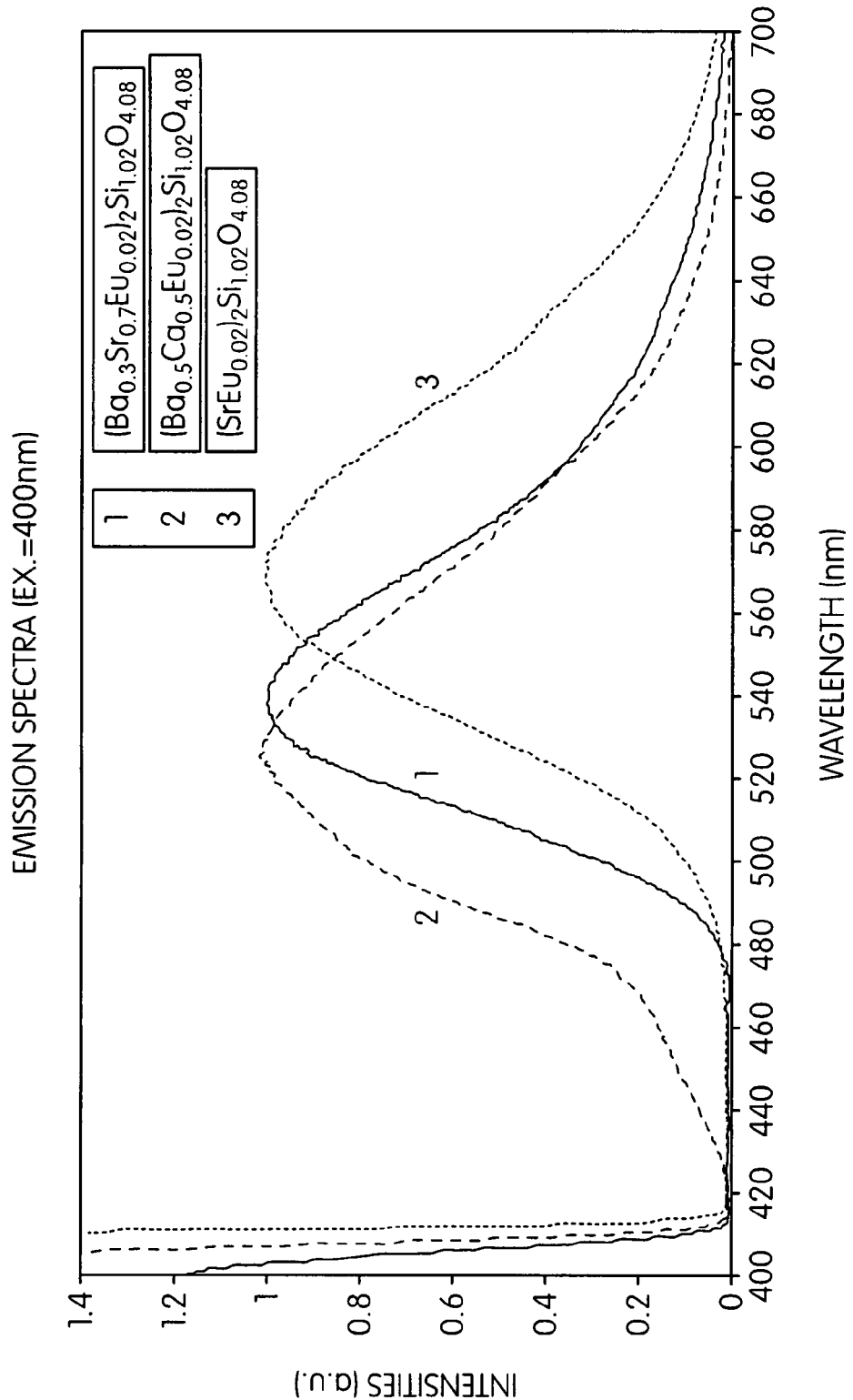
FIG. 6 shows a comparison of yellow phosphors having either Ba and Sr, or Ba and Ca, or Sr alone; specifically, the emission spectra of the yellow phosphors $(Sr_{0.7}Ba_{0.3}Eu_{0.02})_2Si_{1.02}O_{4.08}$, $(Ca_{0.5}Ba_{0.5}Eu_{0.02})_2Si_{0.02}O_{4.08}$, and $(Sr_{0.7}Eu_{0.02})_2Si_{1.02}O_{4.08}$, tested under 400 nm excitation radiation, are shown.

Examples of silicate-based yellow phosphors 33, 43 are shown in FIGS. 6-9. FIG. 6 shows a comparison of yellow phosphors having either Ba and Sr, or Ba and Ca, or Sr alone. Specifically, the emission spectra of the yellow phosphors $(Sr_{0.7}Ba_{0.3}Eu_{0.02})_2Si_{1.02}O_{4.08}$, $(Ca_{0.5}Ba_{0.5}Eu_{0.02})_2Si_{1.02}O_{4.08}$, and $(Sr_{0.7}Eu_{0.02})_2Si_{1.02}O_{4.08}$, tested under 400 nm excitation radiation, are shown in FIG. 6. The data shows that the emission spectrum may be adjusted from green-yellow (with an emission peak occurring at about 520 nm) to orange-yellow (with an emission peak occurring at roughly 580 nm) by varying the content of the Sr, Ba, and/or Ca in this silicate-based phosphor system. By decreasing the amount of Ba slightly and replacing Ca with Sr, the peak emission wavelength may be increased toward yellow. By further increasing the amount of the Sr and eliminating the Ba content, the peak emission wavelength may be increased further.

Figure 7:
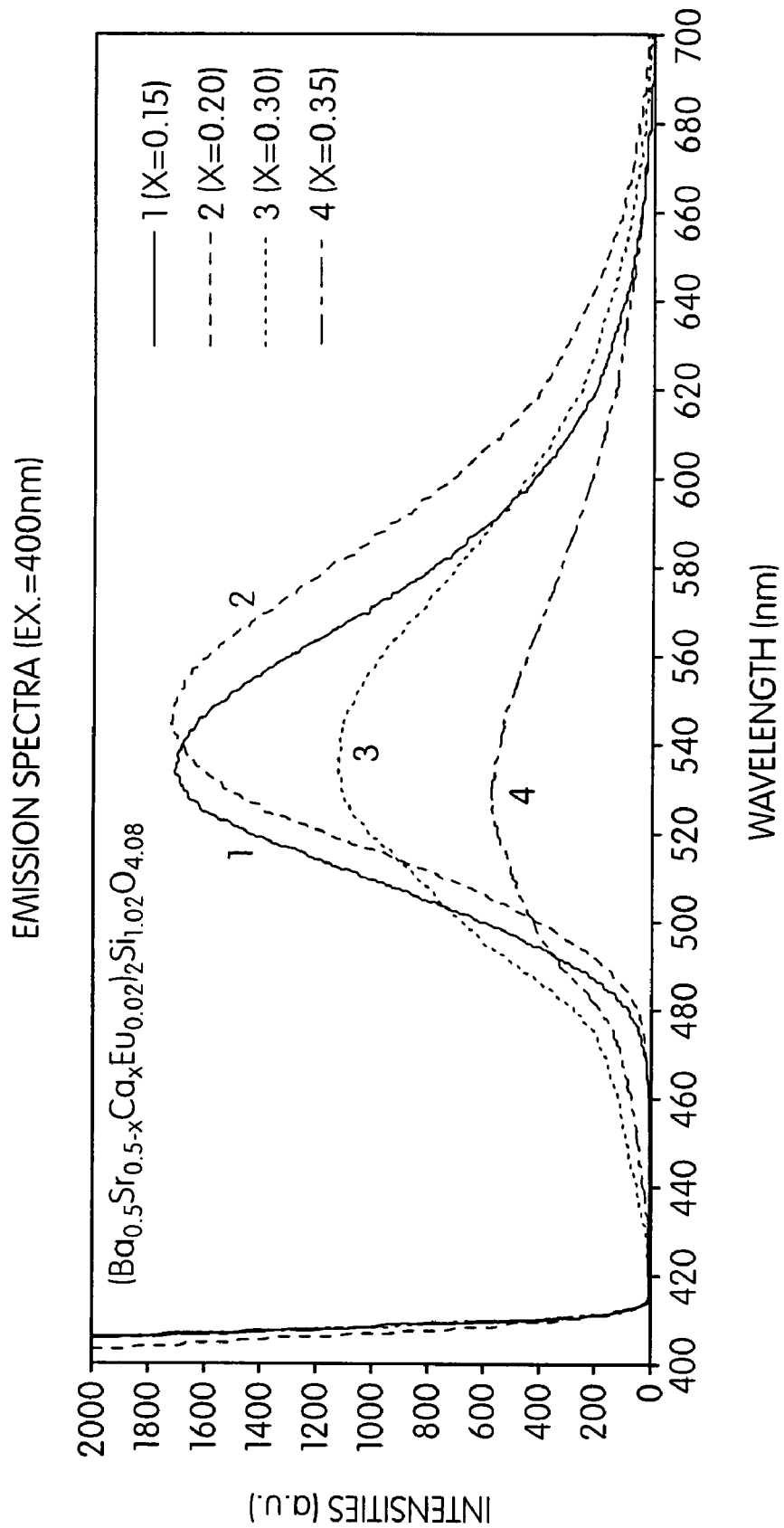
In FIG. 7 is an emission spectrum of an exemplary yellow phosphor containing all three of the elements Ba, Sr, and Ca; the specific phosphor tested in FIG. 7 is $(Ba_{0.5}Sr_{0.5-x}Ca_xEu_{0.02})_2Si_{1.02}O_{4.08}$, where the value of x has been varied between 0.15 and 0.35.

In FIG. 7, a yellow phosphor according to the present embodiments is described wherein the phosphor in this example contains all three of the elements Ba, Sr, and Ca. The specific phosphor tested in FIG. 7 is $(Ba_{0.5}Sr_{0.5-x}Ca_xEu_{0.02})_2Si_{1.02}O_{4.08}$, where the value of x has been varied between 0.15 and 0.35.

In FIG. 8, the emission spectra of the exemplary yellow phosphors $(Sr_{0.7}Ba_{0.3}Eu_{0.02})_2Si_{1.02}O_{4.08}$ and $(Sr_{0.7}Ba_{0.3}Eu_{0.02})_2Si_{1.02}O_{4.08-x}F_x$ were tested under 400 nm excitation radiation. Here, the data shows that the emission intensity is significantly increased by doping the composition with fluorine, or by substituting some of the oxygen content of the composition with fluorine, while the wavelength of the spectrum maintains substantially unchanged.

Figure 9B:
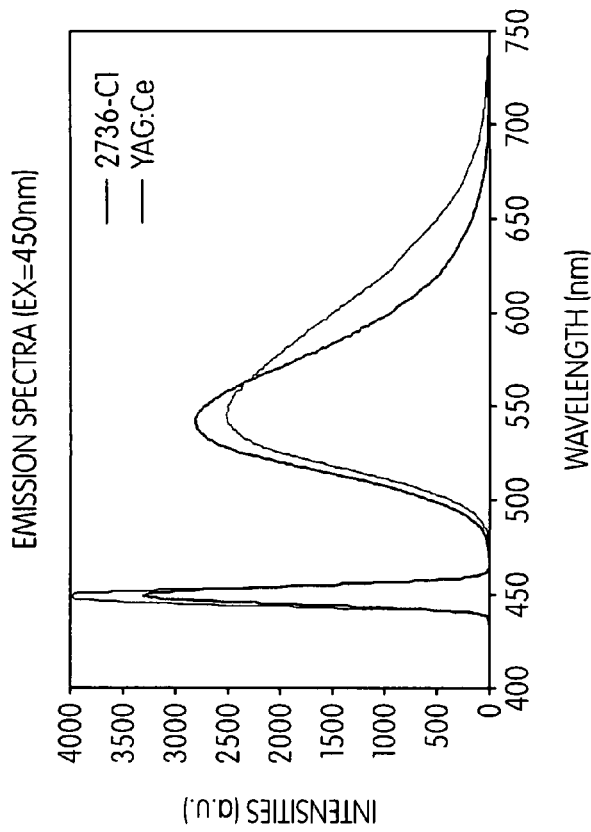
FIGS. 9A and 9B are excitation and emission spectra of the exemplary yellow phosphor $(Sr_{0.7}Ba_{0.3}Eu_{0.02})_2Si_{1.02}O_{4.08-x}F_x$ tested in comparison with a commercial YAG yellow phosphor.
Figure 9A:
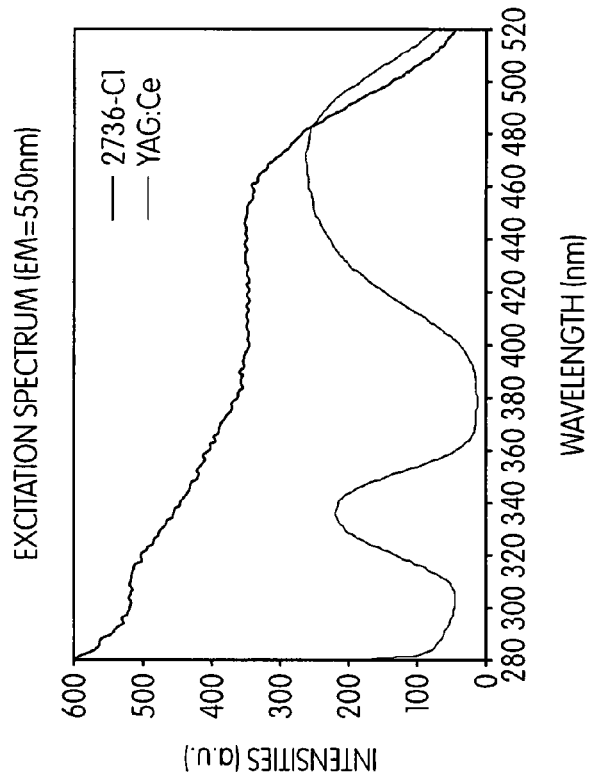

Additional advantages of the exemplary yellow phosphors of the present embodiments are demonstrated by the excitation and emission spectra shown in FIGS. 9A and 9B. FIG. 9B is an emission spectra of the yellow phosphor $(Sr_{0.7}Ba_{0.3}Eu_{0.02})_2Si_{1.02}O_{4.08}:F_x$, where x (which denotes the F content) ranges from 0 to 0.05. The conditions under which this fluorine containing material were tested include 450 nm excitation radiation in order to compare the test results with the emission of a commercial YAG yellow phosphor previously reported in the literature. Furthermore, this excitation wavelength of 450 nm was chosen to compare emission intensities because this is the wavelength where the commercial YAG phosphor is the most responsive, as shown in FIG. 9A. FIG. 9A shows that the YAG phosphor may only be only excited by radiation having a peak wavelength around either 340 nm or 470 nm, whereas the present $(Sr_{0.7}Ba_{0.3}Eu_{0.02})_2Si_{1.02}O_{4.08-x}F_x$ phosphor may be excited by a much broader range of wavelengths, ranging from the entire UV to the blue region of the spectrum (i.e., 280 nm to 470 nm).

Exemplary Blue Phosphors

According to embodiments of the present invention, the blue phosphor 31, 41 may be either a silicate-based phosphor or an aluminate-based phosphor. An exemplary silicate-based blue phosphor has the formula $Sr_{1-x-y}Mg_xBa_ySiO_4:Eu^{2+}F$ where $0 \leq x \leq 1.0$, and $0 \leq y \leq 1.0$. In another embodiment, $0.2 \leq x \leq 1.0$ and $0 \leq y \leq 0.2$. In this embodiment, Mg and Ba are used to replace Sr in the composition.

Figure 10:
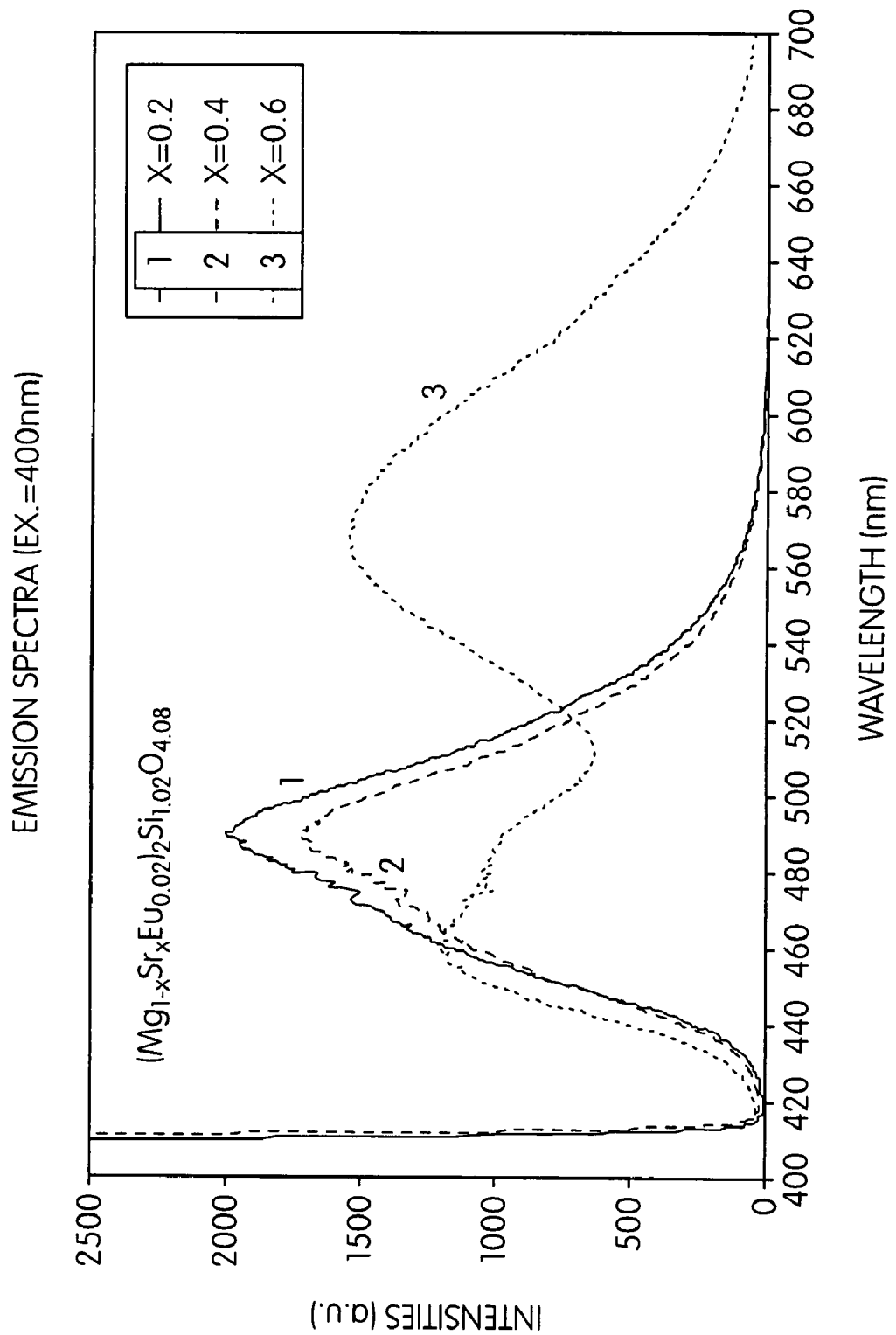
FIG. 10 describes an exemplary silicate-based blue phosphor where the phosphor may have the formula $(Sr_xMg_{1-x}Eu_{0.02})_2SiO_4$ and where the Eu is present in small amounts as a luminescent activator; the Sr may be used to replace the Mg in a single phase solid solution up to about x=0.5 concentration because two separate phases $Mg_2SiO_4$ and $Sr_2SiO_4$ will be formed when the Sr substitution x is 0.6 (as shown in curve 3 of FIG. 10)

In an alternative embodiment of the silicate-based blue phosphor, the phosphor may have the formula $(Sr_xMg_{1-x}Eu_{0.02})_2Si_{1.02}O_4$, where Eu is present in small amounts as an activator; Sr may be used to replace Mg in increasing amounts in the material; and the amount of Si in a $SiO_4$ host is present in an amount greater than a stoichiometric ratio of 1 to 4. Experimental results for such a phosphor are shown in FIG. 10. Referring to FIG. 10, the stoichiometric amount of Sr in the composition has been increased from 20 percent (curve 1) to 40 percent (curve 2), and then increased further to 60 percent (curve 3). The wavelength of the excitation radiation was 400 nm. The results show that blue emission can be efficiently excited by UV to blue radiation when the strontium substitution for magnesium is less than 40 percent in this silicate-based system. Two phases of silicates ($Mg_2SiO_4$ and $Sr_2SiO_4$) are formed when the strontium substitution is higher than 40 percent, and then at least part of the emission shifts to substantially longer wavelengths.

Figure 11:
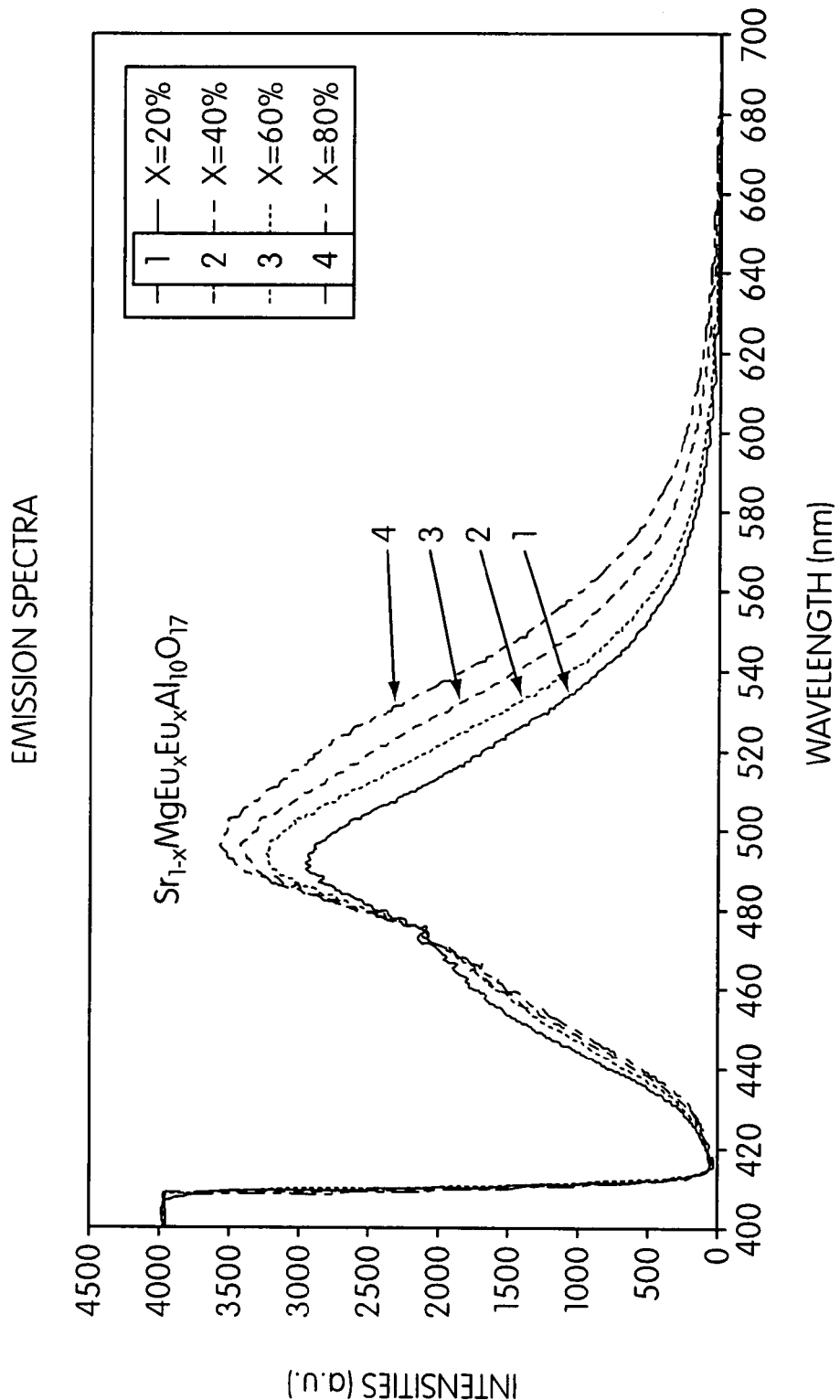
FIG. 11 is an emission spectrum of an exemplary aluminate-based blue phosphor, the phosphor having the formula $Sr_{1-x}MgEu_xAl_{10}O_{17}$ where $0.2 \leq x \leq 1.0$, and wherein a higher concentration of the Eu enhances the peak luminescent intensity and shifts the peak wavelength to longer wavelengths.

Alternatively, the blue phosphor in the present embodiments may be aluminate-based. In one embodiment of an aluminate-based blue phosphor, the phosphor has the formula $Sr_{1-x}MgEu_xAl_{10}O_7$ where $0.2 < x \leq 1.0$. This novel blue phosphor utilizes Eu in a substantially higher amount than that amount used in the prior art. The emission spectra of such a phosphor is shown in FIG. 11 where "x," the Eu content, has been measured at 20, 40, 60, and 80 stoichiometric percent. In these compositions, the Eu is substituting for the Sr, and the wavelength of the excitation radiation was 400 nm. The results show that the Eu concentration affects both the intensity and the wavelength of the emission from this blue phosphor: increasing the Eu content increases both the intensity and the wavelength.

Figure 12:
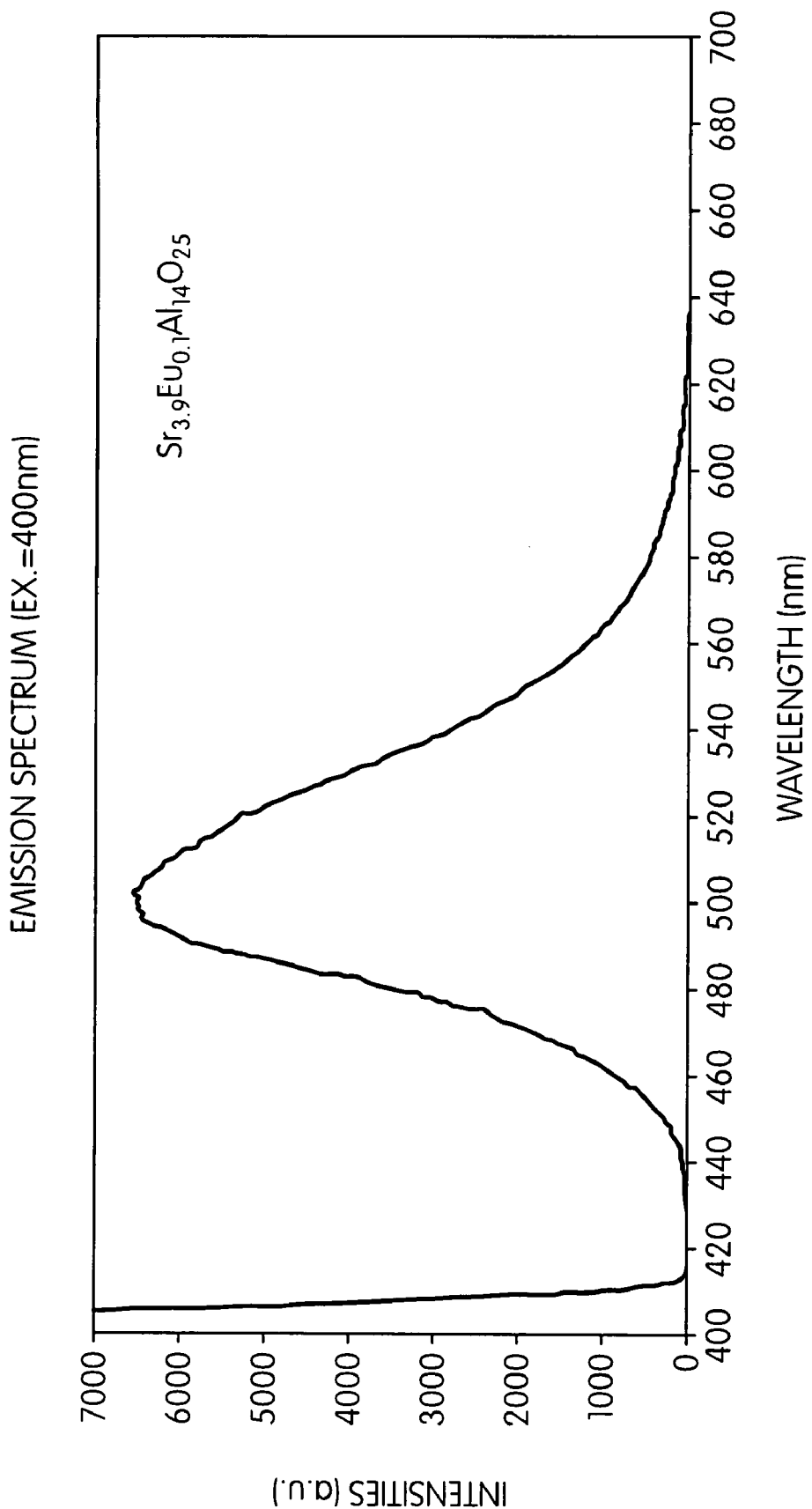
FIG. 12 is an emission spectrum of an alternative exemplary aluminate-based blue phosphor described by the formula $(Sr_{3.9}Eu_{0.1})Al_{14}O_{25}$.

In other embodiments of an aluminate-based blue phosphor, the phosphor has the formula $Sr_{3.9}Eu_{0.1}Al_{14}O_{25}$. Experimental results for this phosphor are illustrated in FIG. 12, where an emission spectrum for the exemplary aluminate-based blue phosphor $(Sr_{3.9}Eu_{0.1})Al_{14}O_{25}$ was measured using 400 nm excitation radiation. The data shows that the peak of the emission is about 500 nm, and the emission ranges from about 460 to 480 nm. Another way to describe this blue aluminate phosphor is by the formula $Sr_xEu_{0.1}Al_{14}O_{25}$, wherein x is less than 4. In other words, the content of the Sr in the composition is less than 4, and it may be 3.9.

Relative Amounts of the Phosphors and Emission Spectra of the White LEDs

Figure 14:
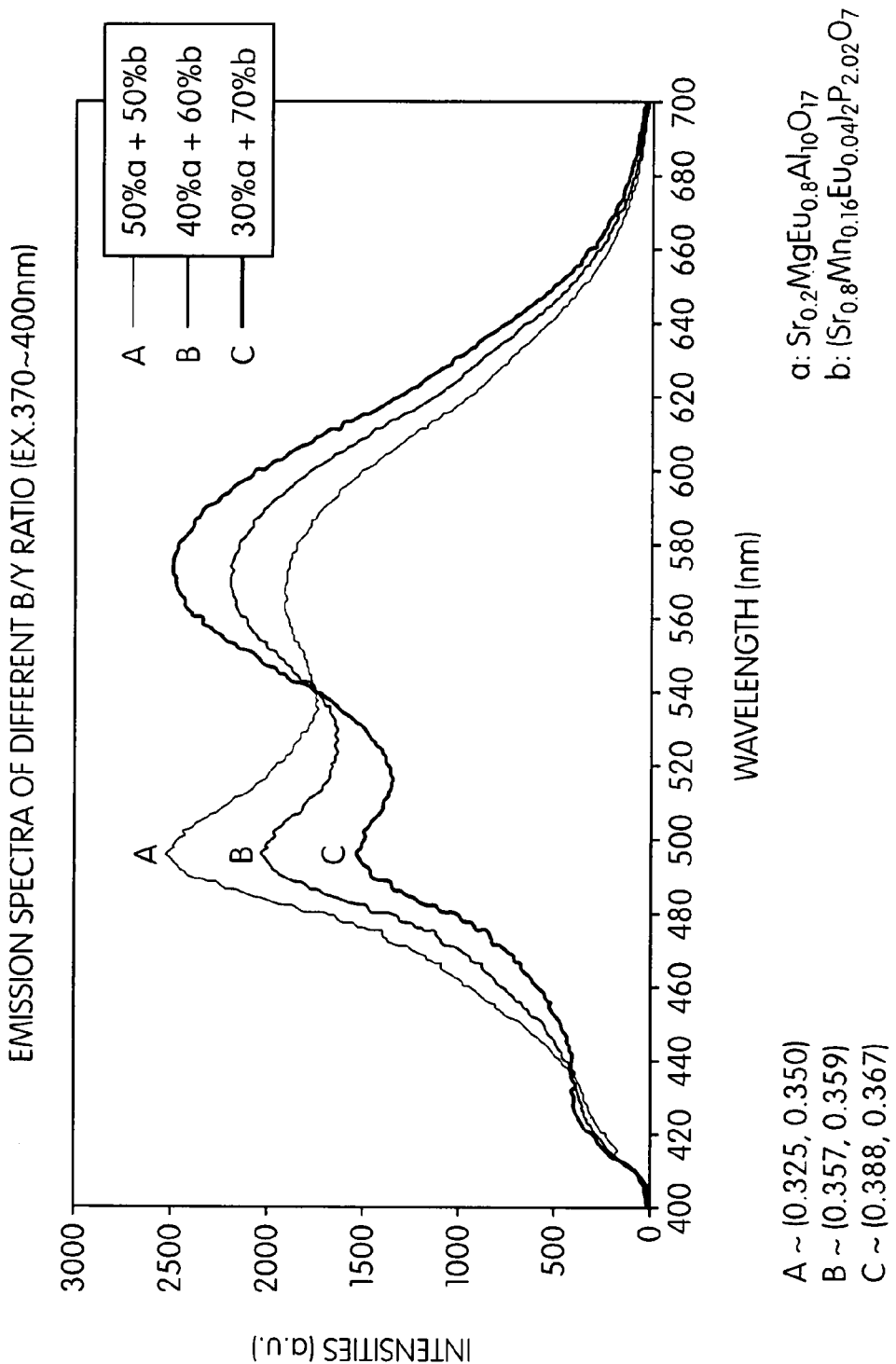
FIG. 14 shows the emission spectra of a white LED having a two phosphor system, wherein the two phosphors of the phosphor system are blue and yellow with one being a phosphate-based yellow phosphor and the other being an aluminate based blue phosphor; the two phosphors are mixed in different ratios such that a high blue phosphor ratio is desired when non-visible UV LED is used for excitation.

It will be understood by those skilled in the art that the present novel phosphor systems may be used in a variety of configurations, and it is certainly not necessary (although it may be desired in some situations) to use one yellow and one blue phosphor. The flexibility of this system is demonstrated in this section by giving exemplary emission spectra of the white LED for several different phosphor systems. In FIG. 14, for example, white light may be generated by using a non-visible UV LED to excite the blue and yellow phosphors according to the present embodiments, and the intensity of the resultant white light may be adjusted by varying the ratio of the two phosphors present in the phosphor system.

Referring to FIG. 14, a white light LED was constructed by mixing a phosphate-based yellow phosphor with an aluminate based blue phosphor, and exciting the two-phosphor mixture with a radiation source that provided excitation radiation ranging from about 370 to 400 nm (in other words, non-visible radiation). The phosphate-based yellow phosphor was $(Sr_{0.8}Mn_{0.16}Eu_{0.04})_2P_{2.02}O_7$, and the aluminate-base blue phosphor was $Sr_{0.2}MgEu_{0.8}Al_{10}O_{17}$. Three-phosphor mixtures were also tested, wherein the relative amounts of the aluminate-based blue phosphor to the phosphate-based yellow phosphor was about 50 to 50 weight percent in curve "A," 40 to 60 weight percent in curve "B," and 30 to 70 weight percent in curve "C." The data shows that the overall emission spectra can be tailored to achieve the desired effect by adjusting the ratio of the amounts of blue to yellow phosphors, thus optimizing the color rendering for different applications as shown in FIG. 16.

Figure 15:
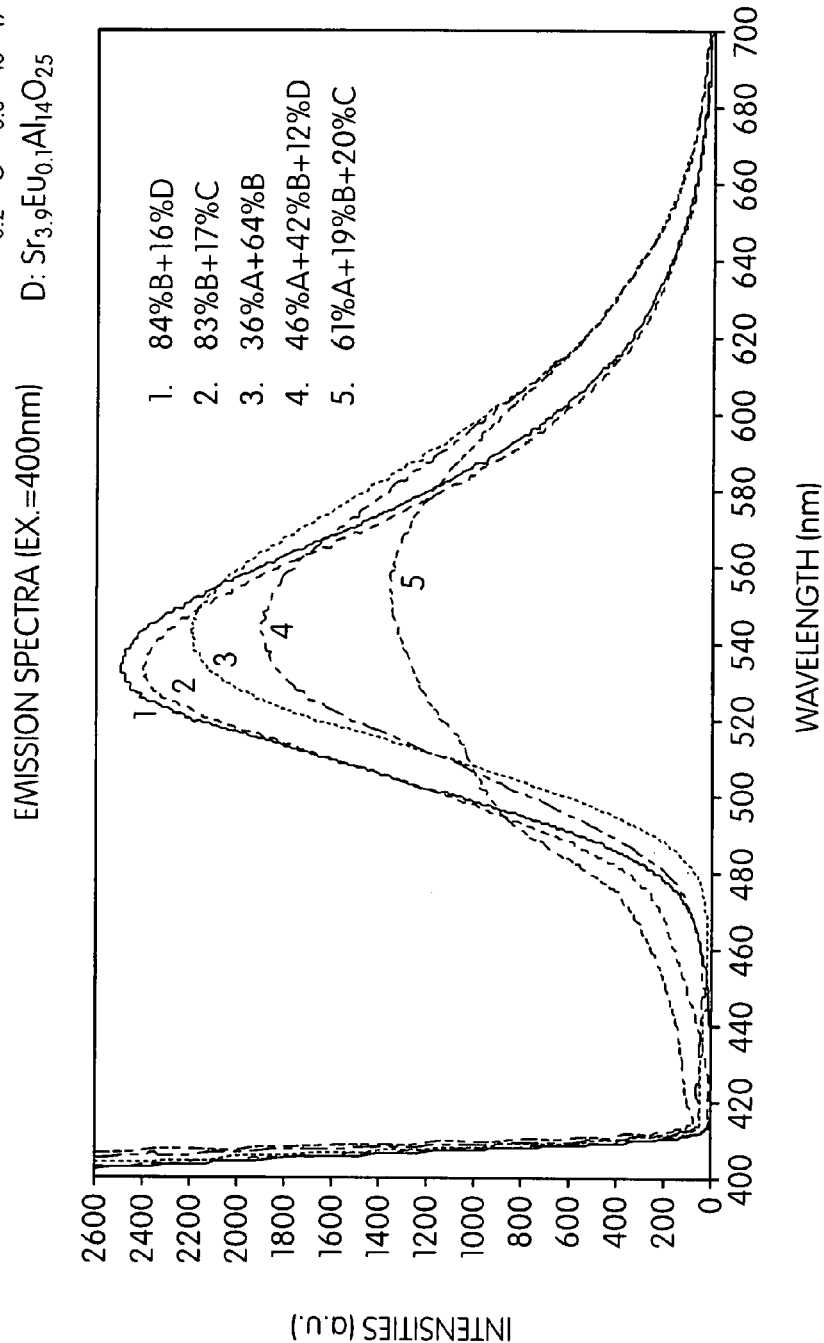
FIG. 15 shows the emission spectra of a white LED constructed from five different phosphor systems designed for near-UV LED; two are blue and yellow two-phosphor systems, one is a two phosphor system having two yellow phosphors, and two are three-phosphor systems having two yellow and one blue phosphors.

A second example of the effect of varying phosphor ratios in two and three phosphor systems is shown in FIG. 15. Here, phosphor A is the phosphate-based yellow phosphor $(Sr_{0.8}Mn_{0.16}Eu_{0.04})_2P_{2.02}O_7$; phosphor B is the silicate-based yellow phosphor $(Ba_{0.3}Sr_{0.7}Eu_{0.02})_2Si_{1.02}O_{4.08}$; phosphor C is the aluminate-based blue phosphor $Sr_{0.2}MgEu_{0.8}Al_{10}O_{17}$; and phosphor D is the aluminate-based blue phosphor $Sr_{3.9}Eu_{0.1}Al_{14}O_{25}$. Curve 1 is the emission spectra from a two phosphor system of 84 weight percent phosphor B and 16 weight percent phosphor D; curve 2 is from a two phosphor system having 83 weight percent phosphor B and 17 weight percent phosphor C; curve 3 is from a two phosphor system of 36 weight percent A and 64 weight percent B; curve 4 is from a three phosphor system having 46 weight percent A, 42 weight percent B, and 12 weight percent D, and curve 5 is from a three phosphor system having 61 weight percent A, 19 weight percent B, and 20 weight percent C.

The data for the exemplary two and three-phosphor systems in FIG. 15 shows that the greatest intensity emissions and the shortest wavelength emission peaks occurs for the blue and yellow two-phosphor systems (curves 1 and 2). Intermediate is the two-phosphor system consisting of a blue and yellow phosphor (curve 3). Although the intensity of the three-phosphor systems consisting of two yellow and one blue phosphors (curves 4 and 5) are the lowest of the group, these emissions have the longest wavelength peak emissions, being shifted more towards the red region of the spectrum.

Figure 16:
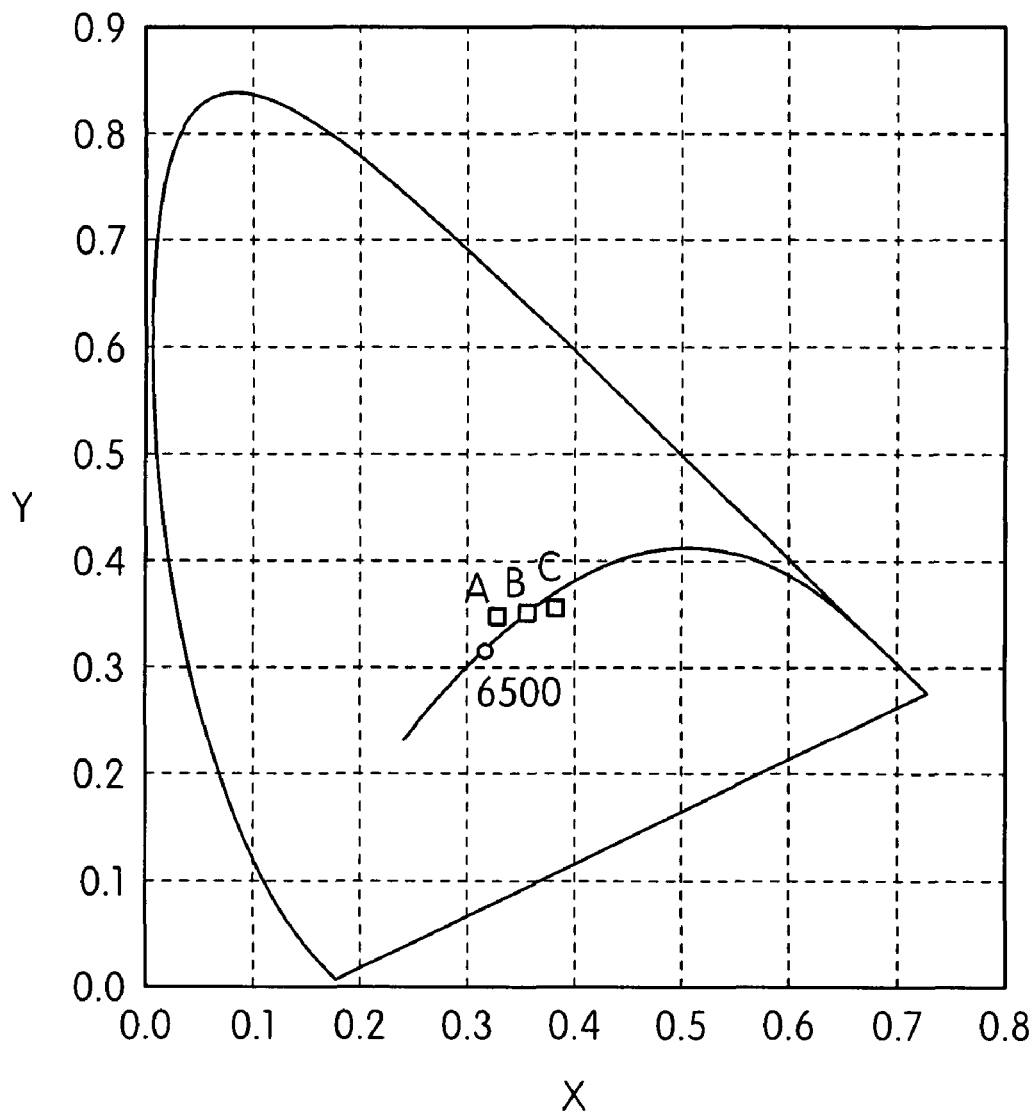
FIG. 16 is a calculation of the color temperature of the three phosphor systems described in FIG. 14.

A calculation of the color temperature of the white light from the three ratios of the two yellow phosphor system of FIG. 14 is shown in FIG. 16.

Single Phosphor Systems

Figure 13:
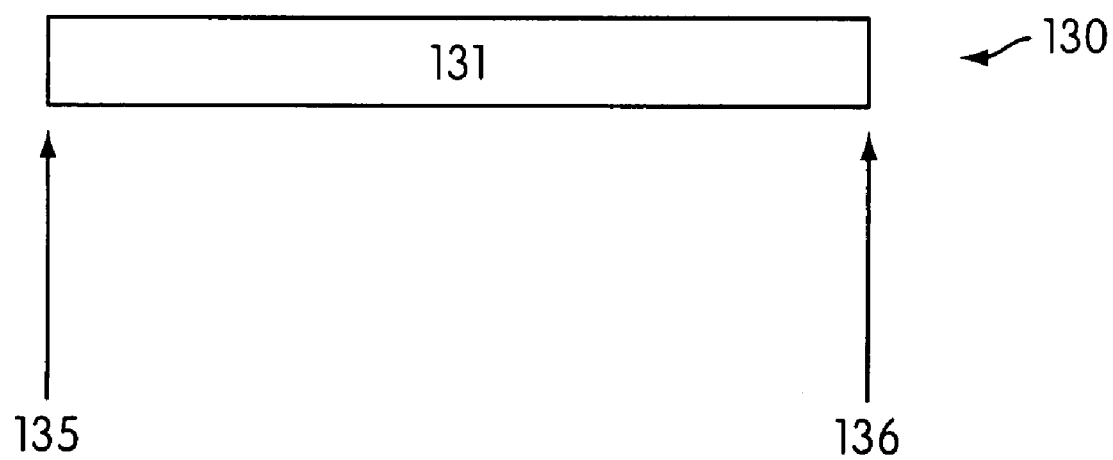
FIG. 13 is a schematic representation of the emission wavelength from a single phosphor system used in conjunction with a non-visible (to purple) radiation source.

In other embodiments of the present invention, a single phosphor may be used with a non-visible (to purple) radiation source. This concept is illustrated in FIG. 13 in the schematic shown generally at 130, where a phosphor 131 has a short wavelength end 135, and a long wavelength end 136. The single phosphor is used in conjunction with a radiation source providing excitation radiation to the single phosphor in the non-visible to purple region of the spectrum, the excitation radiation ranging from about 250 to 430 nm.

An exemplary phosphor for a single phosphor system is the silicate-based yellow phosphor containing all three of the elements Ba, Sr, and Ca, and containing a small amount of an Eu activator. An example of such a phosphor has already been shown in FIG. 7, where the specific phosphor $(Ba_{0.5}Sr_{0.5-x}Ca_xEu_{0.02})_2Si_{1.02}O_{4.08}$, was tested for values of the Ca content ("x") varying between 0.15 and 0.35. In this embodiment, it is advantageous to utilize an excitation radiation having a wavelength range of about 400 to 430 nm from the non-visible to purple LED. This exemplary phosphor was tested to have an emission wavelength peak at about 540 nm, a short wavelength end 135 (in reference to FIG. 13) of about 480 nm, and a long wavelength end 136 (again, in reference to FIG. 13) of about 640 nm.

In an alternative embodiment of the single phosphor concept, the single phosphor may be a silicate-based yellow phosphor having a small amount of Eu and a composition containing only Sr, such as the phosphor represented by curve 3 in FIG. 6. Here the emission wavelength peak occurs at about 570 nm; the short wavelength end of the emission occurs at about 500 nm, and the long wavelength end occurs at about 680 nm.

Thus, it is demonstrated that it is feasible to construct a white light illumination system using a non-visible to purple LED as a radiation source, and a single phosphor receiving excitation radiation from the radiation source and emitting white light illumination.

The Radiation Source

An exemplary radiation source configured to emit radiation having a wavelength ranging from about 250 to 420 nm comprises at least one semiconductor layer selected from the group consisting of GaN, ZnSe, and SiC, and at least one active region comprising a p-n junction selected from the group consisting of GaN, AlGaN, InGaN, and InAlGaN.

Color Temperature and Color Rendering Index

According to embodiments of the present invention, the white light illumination produced by the present white LED systems have a color temperature ranging from about 3000 to 6500 K. The color rendering index (CRI) of the white light illumination is greater than about 70.

Methods of Preparing the Phosphor System

Exemplary methods of preparing the present phosphors include a sol-gel method and a solid reaction method. The sol-gel method may be used to produce powder phosphors, including those that are aluminate, phosphate and silicate-based. A typical procedure comprised the steps of:

1. a) Dissolving certain amounts of alkaline earth nitrates (Mg, Ca, Sr, Ba), and $Eu_2O_3$ and/or $Mn(NO_3)_2$ in dilute nitric acid; and
    b) Dissolving corresponding amount of aluminum nitrate, $NH_4H_2PO_4$ or silica gel w in de-ionized water to prepare a second solution.
2. After the solids of the two solutions of steps 1a) and 1b) above were substantially in solution, the two solutions were mixed and stirred for two hours. Ammonia was then used to generate a gel in the mixture solution. Following formation of the gel, the pH was adjusted to about 9.0, and the gelled solution stirred continuously stirred at about 60° C. for about 3 hours.
3. After drying the gelled solution by evaporation, the resulted dry gel was calcined at 500 to 700° C. for about 60 minutes to decompose and acquire oxides.
4. After cooling and grinding, the solid was sintered in a reduced atmosphere for about 6 to 10 hours. For aluminate and silicate-based phosphors, flux was used to improve the sintering properties, and the sintering temperature ranged from about 1300 to 1500° C. For the phosphate-based phosphors, the sintering temperature ranged from about from 900 to 1100° C.
5. For fluorine-containing silicate phosphors, $NH_4F$ powder with about 5 weight percent was used to mix with the cacined stoichiometric silicates before the final sintering in reduction atmosphere. The sintering temperature was usually about 100° C. lower than the non-fluorine containing silicates since fluorides may under certain conditions act as flux agents.

Alternatively, the solid reaction method was used to produce the powder phosphors including aluminate, phosphate and silicate-based phosphors. The steps of a typical procedure used for the solid reaction method are as follows:

1. Desired amounts of alkaline earth oxides or carbonates (Mg, Ca, Sr, Ba), dopants of $Eu_2O_3$ and/or MnO, corresponding $Al_2O_3$, $NH_4H_2PO_4$ or $SiO_2$ were wet mixed with a ball mill.
2. After drying and grinding, the resulting powder was sintered in a reduced atmosphere for about 6 to 10 hours. For the aluminate and silicate-based phosphors, flux was used to improve the sintering properties, and the sintering temperature ranged from 1300 to 1500° C. For the phosphate-based phosphors, the sintering temperature ranged from about 900 to 1100° C.

Many modifications of the exemplary embodiments of the invention disclosed above will readily occur to those skilled in the art. Accordingly, the invention is to be construed as including all structure and methods that fall within the scope of the appended claims.

What is claimed is:

1. A white LED comprising:
   a radiation source configured to emit radiation having a wavelength ranging from about 250 to 420 nm;
   a yellow phosphor configured to absorb at least a portion of the radiation from the radiation source, and emit light within a wavelength range such that shortest wavelength of the range is about 530 nm, wherein the yellow phosphor has the formula $A_2SiO_4:Eu^{2+}F$ and A is at least one of a divalent metal selected from the group consisting of Sr, Ca, Ba, Mg, Zn, and Cd, and wherein the fluorine dopant substitutes for oxygen; and
   a blue phosphor configured to absorb at least a portion of the radiation from the radiation source and emit light within a wavelength range such that the longest wavelength of the range is about 520 nm, such that the gap between the shortest wavelength of the yellow phosphor and longest wavelength of the blue phosphor is about 10 nm.

2. The white LED of claim 1, wherein the shortest wavelength of the emitted yellow light is about 535 nm, and the longest wavelength of the emitted blue light is about 515 nm, such that the gap is about 20 nm.

3. The white LED of claim 1, wherein the shortest wavelength of the emitted yellow light is about 540 nm, and the longest wavelength of the emitted blue light is about 510 nm, such that the gap is about 30 nm.

4. The white LED of claim 1, wherein the shortest wavelength of the emitted yellow light is about 545 nm, and the longest wavelength of the emitted blue light is about 505 nm, such that the gap is about 40 nm.

5. The white LED of claim 1, wherein the shortest wavelength of the emitted yellow light is about 550 nm, and the longest wavelength of the emitted blue light is about 500 nm, such that the gap is about 50 nm.

6. A white LED comprising:
   a radiation source configured to emit radiation having a wavelength ranging from about 250 to 420 nm;
   a yellow phosphor configured to absorb at least a portion of the radiation from the radiation source, and emit light within a wavelength range such that shortest wavelength of the range is at about 530 nm, wherein the yellow phosphor has the formula $A_2SiO_4:Eu^{2+}F$ and A is at least one of a divalent metal selected from the group consisting of Sr, Ca, Ba, Mg, Zn, and Cd, and wherein the fluorine dopant substitutes for oxygen; and
   a blue phosphor configured to absorb at least a portion of the radiation from the radiation source and emit light within a wavelength range such that the longest wavelength of the range is at about 500 nm, such that the center of the gap between the shortest wavelength of the yellow phosphor and longest wavelength of the blue phosphor is at least about 515 nm.

7. The white LED of claim 6, wherein the shortest wavelength of the emitted yellow light is about 535 nm, and the longest wavelength of the emitted blue light is about 505 nm, such that the center of the gap is about 520 nm.

8. The white LED of claim 6, wherein the shortest wavelength of the emitted yellow light is about 540 nm, and the longest wavelength of the emitted blue light is about 510 nm, such that the center of the gap is about 525 nm.

9. The white LED of claim 6, wherein the shortest wavelength of the emitted yellow light is about 545 nm, and the longest wavelength of the emitted blue light is about 515 nm, such that the center of the gap is about 530 nm.

10. The white LED of claim 6, wherein the shortest wavelength of the emitted yellow light is about 550 nm, and the longest wavelength of the emitted blue light is about 520 nm, such that the center of the gap is about 535 nm.

* * * * *